United States Patent
Isogai et al.

(10) Patent No.: US 9,082,822 B2
(45) Date of Patent: Jul. 14, 2015

(54) METHOD OF MANUFACTURING SEMICONDUCTOR DEVICE

(71) Applicant: KABUSHIKI KAISHA TOSHIBA, Minato-ku, Tokyo (JP)

(72) Inventors: Tatsunori Isogai, Yokohama (JP); Tomonori Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/013,589

(22) Filed: Aug. 29, 2013

(65) Prior Publication Data
US 2014/0004690 A1    Jan. 2, 2014

Related U.S. Application Data

(63) Continuation of application No. PCT/JP2012/051906, filed on Jan. 24, 2012.

(30) Foreign Application Priority Data

Mar. 3, 2011    (JP) .................................. 2011-46134

(51) Int. Cl.
*H01L 21/26* (2006.01)
*H01L 21/324* (2006.01)
(Continued)

(52) U.S. Cl.
CPC ...... *H01L 21/76838* (2013.01); *H01L 21/3003* (2013.01); *H01L 21/324* (2013.01); *H01L 27/10894* (2013.01); *H01L 21/26506* (2013.01); *H01L 21/76883* (2013.01)

(58) Field of Classification Search
CPC .................................................. H01L 21/76883
USPC .................................................. 438/618, 660
See application file for complete search history.

(56) References Cited

U.S. PATENT DOCUMENTS 6,475,855 B1    11/2002    Fishburn
6,521,977 B1 *    2/2003    Burnham et al. ............. 257/649
(Continued)

FOREIGN PATENT DOCUMENTS

EP    0 614 216    9/1994
GB    2 230 137    10/1990
(Continued)

OTHER PUBLICATIONS

English-language International Search Report from Japanese Patent Office for International Application No. PCT/JP2012/051906, mailed May 16, 2012.
(Continued)

*Primary Examiner* — George Fourson, III
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming a transistor including a gate insulator and a gate electrode on a substrate. The method further includes forming an interconnect structure including one or more interconnect layers on the substrate by performing first and second processes one or more times, the first process forming an interconnect layer on the substrate, and the second process processing the interconnect layer into an interconnect pattern. The method further includes annealing the substrate by irradiating the substrate with a microwave, after at least one interconnect layer included in the one or more interconnect layers is processed into an interconnect pattern on the substrate.

25 Claims, 8 Drawing Sheets

(51) Int. Cl.
*H01L 21/768* (2006.01)
*H01L 21/30* (2006.01)
*H01L 27/108* (2006.01)
*H01L 21/265* (2006.01)

(56) References Cited

U.S. PATENT DOCUMENTS

| | | | |
|---|---|---|---|
| 6,838,298 B2 | 1/2005 | Lee | |
| 7,985,617 B2 | 7/2011 | Smythe et al. | |
| 8,067,313 B2 | 11/2011 | Nakamura | |
| 8,143,697 B2* | 3/2012 | Seh et al. | 257/532 |
| 8,148,190 B2* | 4/2012 | Yang | 438/70 |
| 8,404,577 B2* | 3/2013 | Boemmels et al. | 438/597 |
| 8,580,686 B1* | 11/2013 | Deniz | 438/680 |
| 8,685,809 B2* | 4/2014 | Doris et al. | 438/197 |
| 2002/0031920 A1 | 3/2002 | Lyding et al. | |
| 2003/0022437 A1 | 1/2003 | Fishburn | |
| 2003/0096438 A1 | 5/2003 | Lee | |
| 2003/0102529 A1 | 6/2003 | Burnham et al. | |
| 2005/0170543 A1 | 8/2005 | Sugawara et al. | |
| 2008/0173985 A1* | 7/2008 | Belyansky et al. | 257/649 |
| 2008/0227247 A1* | 9/2008 | Engel et al. | 438/197 |
| 2010/0062562 A1 | 3/2010 | Smythe et al. | |
| 2010/0096707 A1* | 4/2010 | Sugawara et al. | 257/411 |
| 2010/0193914 A1 | 8/2010 | Nakamura | |
| 2011/0008952 A1 | 1/2011 | Aoyama | |
| 2011/0076842 A1 | 3/2011 | Yoshino et al. | |
| 2011/0111580 A1 | 5/2011 | Aoyama et al. | |
| 2011/0180862 A1* | 7/2011 | Anderson et al. | 257/296 |
| 2011/0215333 A1 | 9/2011 | Aoyama et al. | |
| 2011/0237042 A1 | 9/2011 | Smythe et al. | |

FOREIGN PATENT DOCUMENTS

| | | |
|---|---|---|
| JP | 7-66197 | 3/1995 |
| JP | 2005-86023 | 3/2005 |
| JP | 2007-173398 | 7/2007 |
| JP | 2008-108769 | 5/2008 |
| JP | 2009-295956 | 12/2009 |
| JP | 2010-10578 | 1/2010 |
| JP | 2010-16128 | 1/2010 |
| JP | 2010-232239 | 10/2010 |
| WO | WO 03/056622 | 7/2003 |

OTHER PUBLICATIONS

Lu, Y-L et al., "Nanoscale p-MOS Thin-Film Transistor with TiN Gate Electrode Fabricated by Low-Temperature Microwave Dopant Activation," IEEE Electron Device Letters, vol. 31, No. 5, pp. 437-439, (May 2010).

Buchta, R. et al., "Microwave Heating for VLSI Processing," Proceeding of the European Microwave Conference, vol. 1, pp. 34-46, (Aug. 1992).

Office Action issued by the Taiwanese Patent Office on Apr. 21, 2014, for Taiwanese Patent Application No. 100149598, and English-language translation thereof.

Notification of Reason for Rejection issued by the Japanese Patent Office on Apr. 25, 2014, for Japanese Patent Application No. 2011-046134, and English-language translation thereof.

\* cited by examiner

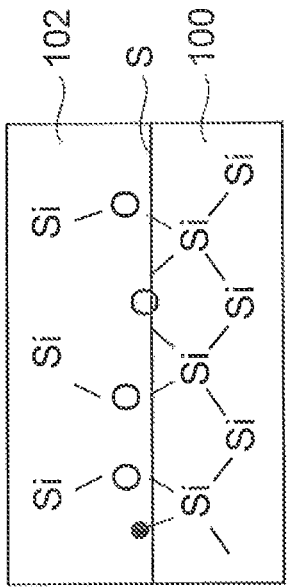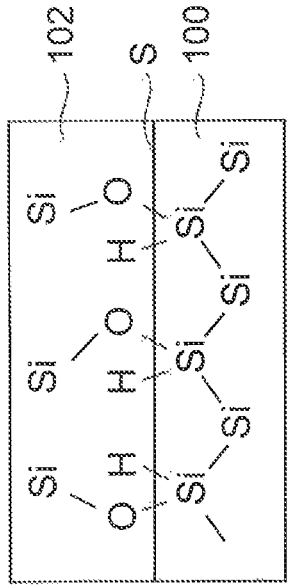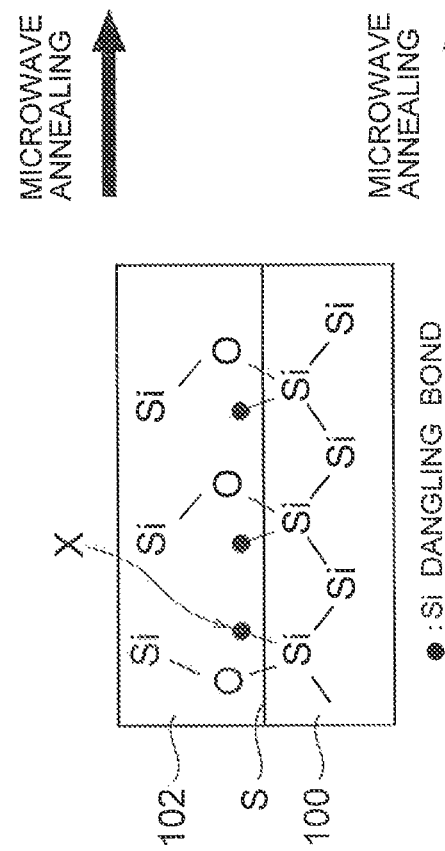

US 9,082,822 B2

METHOD OF MANUFACTURING SEMICONDUCTOR DEVICE

CROSS REFERENCE TO RELATED APPLICATION

This application is a Continuation of International Application No. PCT/JP2012/051906, filed on Jan. 24, 2012, and claims priority of Japanese Patent Application No. 2011-46134, filed on Mar. 3, 2011, the content of both of which are incorporated herein by reference.

FIELD

Embodiments described herein relate to a method of manufacturing a semiconductor device.

BACKGROUND

In semiconductor processes of forming an MOS transistor, heat treatment of a wafer is generally performed in the final process in an atmosphere containing hydrogen. Due to this heat treatment, dangling bonds (uncombined hands) which exist in an interface between a substrate and a gate insulator are terminated and stabilized by hydrogen. As a result, the interface level density in the interface between the substrate and the gate insulator is reduced. In general, this process is called sintering process (or hydrogen sintering process).

In a high performance LSI of the next generation or later, it is demanded to apply materials which have not been conventionally used, to the LSI manufacturing process to form a gate electrode, an interconnect, an inter layer dielectric, a memory element and the like. Some of those materials may be degraded in characteristics remarkably due to high temperature heat treatment or a reducing atmosphere containing hydrogen in the hydrogen sintering process.

Such degradations in characteristics can be suppressed by lowering the temperature in the hydrogen sintering process. In this case, however, the diffusion rate of hydrogen molecules and the reaction rate between the hydrogen molecules and the dangling bonds also become lower. Therefore, the lowering of the temperature is not desirable in terms of the original object, i.e., the reduction of the interface level density. Therefore, a process which can reduce the interface level density in the interface between the substrate and the gate insulator while suppressing the characteristic degradation of the materials of the LSI is needed.

BRIEF DESCRIPTION OF THE DRAWINGS

FIGS. 4A to 4C are schematic diagrams for explaining effects of microwave annealing on dangling bonds;

DETAILED DESCRIPTION

Embodiments will now be explained with reference to the accompanying drawings.

An embodiment described herein is a method of manufacturing a semiconductor device, the method including forming a transistor including a gate insulator and a gate electrode on a substrate. The method further includes forming an interconnect structure including one or more interconnect layers on the substrate by performing first and second processes one or more times, the first process forming an interconnect layer on the substrate, and the second process processing the interconnect layer into an interconnect pattern. The method further includes annealing the substrate by irradiating the substrate with a microwave, after at least one interconnect layer included in the one or more interconnect layers is processed into an interconnect pattern on the substrate.

First Embodiment

FIGS. 1A to 3B are side sectional views showing a method of manufacturing a semiconductor device of a first embodiment. In the first embodiment, a logic LSI is manufactured as the semiconductor device.

Figure 1A:
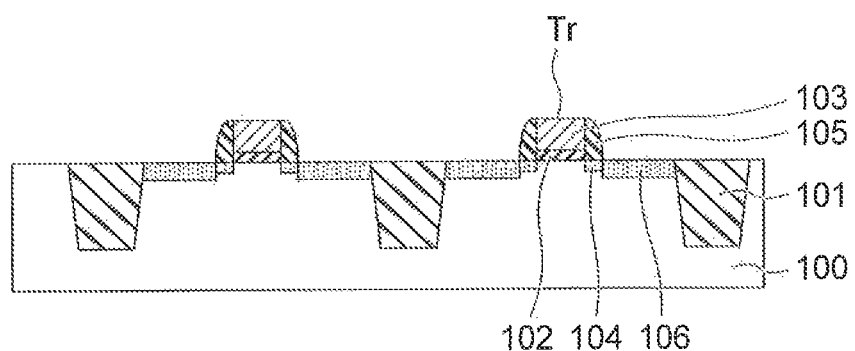
FIGS. 1A to 3B are side sectional views showing a method of manufacturing a semiconductor device of a first embodiment.

As shown in FIG. 1A, isolation insulators 101 are first formed in a substrate 100. MOS transistors Tr for the logic LSI are then formed on the substrate 100 between the isolation insulators 101.

The MOS transistors Tr are formed as described below. An insulation material for gate insulators 102 and an electrode material for gate electrodes 103 are first formed on the substrate 100 successively, and the electrode material is then etched to be the gate electrodes 103. Next, extension regions 104 are formed to sandwich the gate electrodes 103, and sidewall insulators 105 are then formed on side surfaces of the gate electrodes 103. Next, source and drain regions 106 are formed to sandwich the gate electrodes 103. Although the substrate 100 is a semiconductor substrate such as a silicon substrate in the present embodiment, the substrate 100 may be a semiconductor on insulator (SOI) substrate.

Figure 1B:
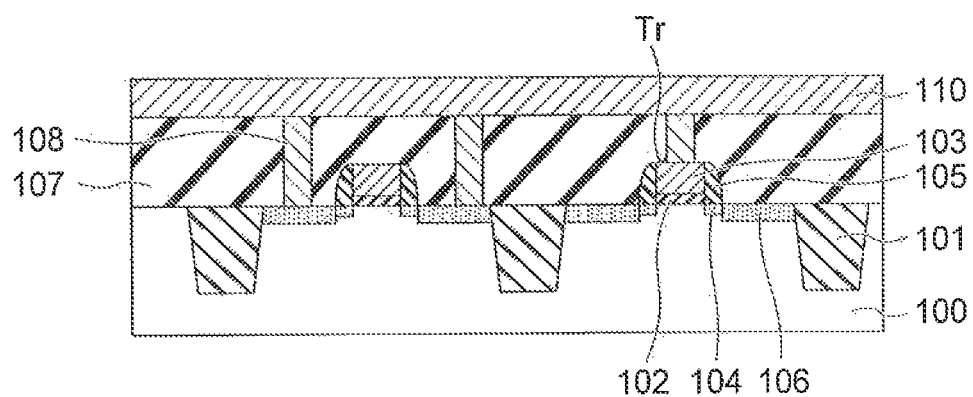

As shown in FIG. 1B, an inter layer dielectric 107 is then formed on the substrate 100 to cover the MOS transistors Tr. Contact plugs 108 are formed in the inter layer dielectric 107. A first interconnect layer 110 as a first layer of interconnect layers is formed on the inter layer dielectric 107. Although the first interconnect layer 110 is a metallic interconnect layer in the present embodiment, the first interconnect layer 110 may be a polysilicon interconnect layer (the same is also true of other interconnect layers described later). The first interconnect layer 110 is electrically connected to the substrate 100 or the gate electrodes 103 via the contact plugs 108.

Each contact plug 108 includes a plug material and a barrier metal layer formed under the plug material. The plug material is tungsten (W) for example. In the same way, the first interconnect layer 110 includes an interconnect material and a barrier metal layer formed under the interconnect material. The interconnect material is aluminum (Al) for example. The same is also true of via plugs and other interconnect layers described later.

Figure 2A:
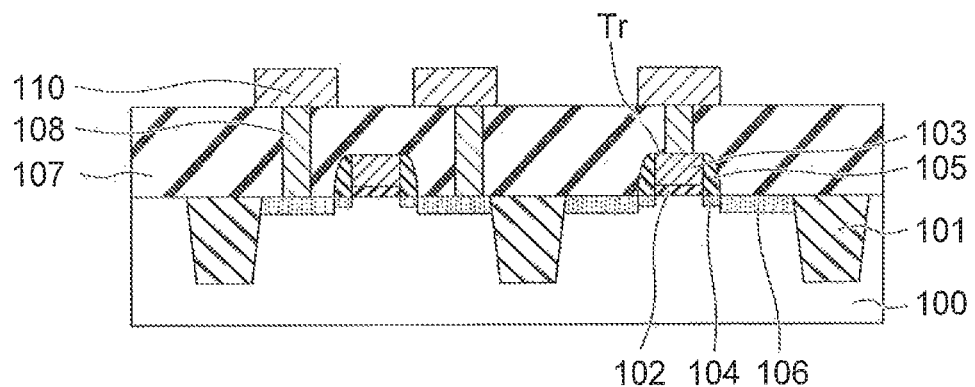

As shown in FIG. 2A, the first interconnect layer 110 is then processed into interconnect patterns by dry etching such as reactive ion etching (RIE). In this way, the interconnect patterns of the first interconnect layer 110 are formed above the substrate 100.

Figure 2B:
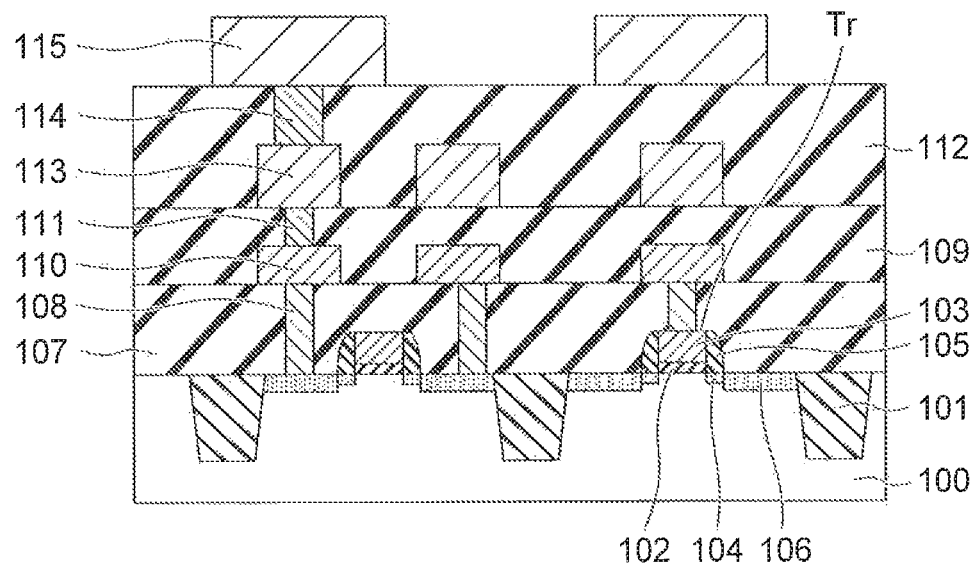

In the present embodiment, the process shown in FIG. 1B and the process shown in FIG. 2A are repeated three times in total. As a result, as shown in FIG. 2B, a first inter layer dielectric 109 as a first layer of inter layer dielectrics, a first via plug 111 as a via plug in a first via plug layer, interconnect patterns of a second interconnect layer 113 as a second layer of the interconnect layers, a second inter layer dielectric 112 as a second layer of the inter layer dielectrics, a second via plug 114 as a via plug in a second via plug layer, and interconnect patterns of a third interconnect layer 115 as a third layer of the interconnect layers are formed above the substrate 100, as well as the inter layer dielectric 107 under the interconnect structure, the contact plugs 108, and the first interconnect layer 110. The processes shown in FIGS. 1B and 2A are examples of first and second processes, respectively.

In this way, the interconnect structure including three interconnect layers 110, 113 and 115 are formed above the substrate 100. The first interconnect layer 110 is a bottommost interconnect layer in the interconnect structure, and the third interconnect layer 115 is a topmost interconnect layer in the interconnect structure.

The semiconductor device of the present embodiment may include only one or two interconnect layers, or may include four or more interconnect layers. In the former case, the processes shown in FIGS. 1B and 2A are performed only once or twice. In the latter case, the processes shown in FIGS. 1B and 2A are repeated four or more times.

Figure 3A:
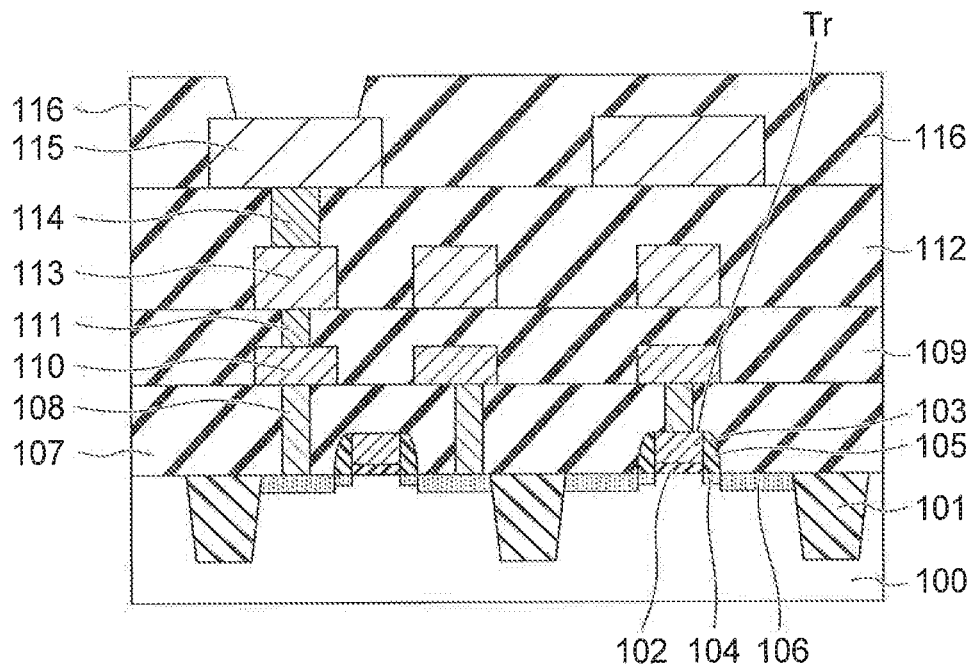

As shown in FIG. 3A, a passivation film 116 is then formed on the second inter layer dielectric 112 to cover the third interconnect layer 115. The passivation film 116 is formed by depositing a silicon oxide film and a silicon nitride film successively by plasma chemical vapor deposition (CVD), for example.

As shown in FIG. 3A, the passivation film 116 is then removed partially by photolithography and etching to form an aperture in the passivation film 116. As a result, a part of the third interconnect layer 115 is exposed in the aperture. A part of the third interconnect layer 115 finally exposed in the aperture is referred to as pad electrode.

Figure 3B:
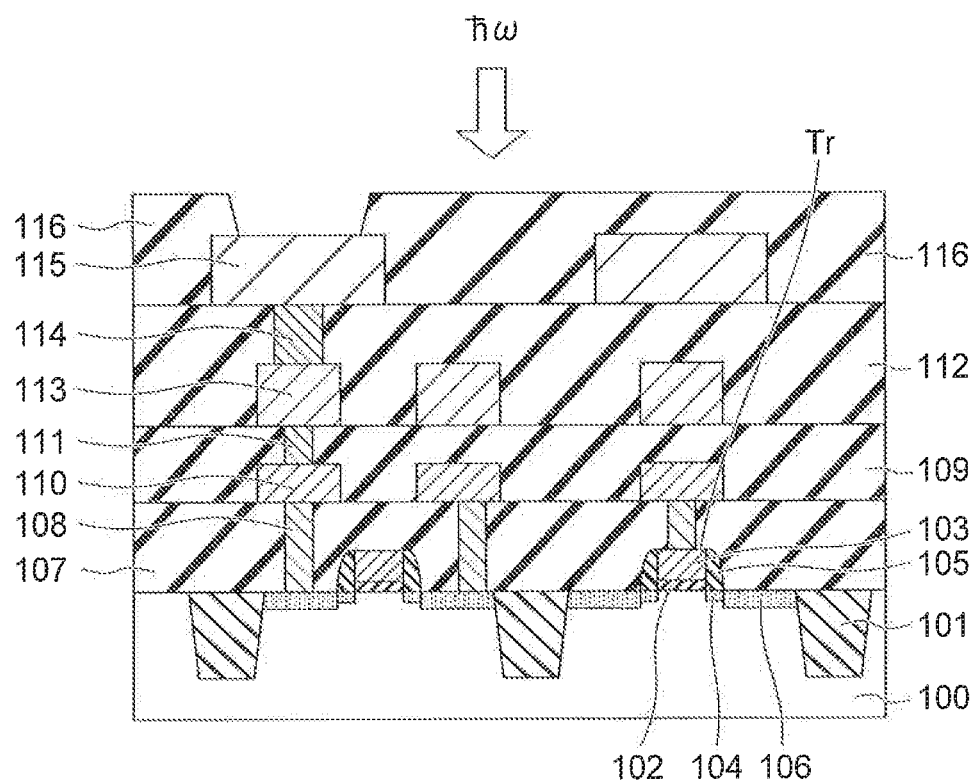

A sintering process which heats the substrate 100 is then performed to lower the interface level density in the interface between the substrate 100 and the gate insulator 102 (FIG. 3B). In the present embodiment, microwave annealing of the substrate 100 is performed as the sintering process. In other words, the substrate 100 is annealed by irradiating the substrate 100 with a microwave. As a result, the interface level density in the interface between the substrate 100 and the gate insulator 102 is lowered.

In this way, the microwave annealing of the substrate 100 in the present embodiment is performed after forming the third interconnect layer 115 which is the topmost interconnect layer and processing the third interconnect layer 115 into the interconnect patterns. Advantages of performing the microwave annealing after forming and processing the topmost interconnect layer will be described later.

In the present embodiment, the microwave annealing is performed after forming and processing the passivation film 116. However, the microwave annealing may be performed before forming or processing the passivation film 116 as long as it is performed after forming and processing the third interconnect layer 115.

In the present embodiment, the MOS transistors Tr and the multilayer interconnect structure are formed by the processes shown in FIGS. 1A to 3A before the microwave annealing. However, the processes performed before the microwave annealing may be different from the processes shown in FIGS. 1A to 3A.

Another example of the sintering process using the microwave is a method of obtaining a sintering effect by generating plasma in a space above the substrate by means of irradiation with the microwave and then irradiating the substrate with active species (such as ions and radicals) generated in the plasma. On the other hand, in the sintering process of the present embodiment, the sintering effect is obtained by irradiating the substrate 100 with the microwave and thereby annealing the substrate 100. The present embodiment has an advantage that the sintering effect can be obtained even if the plasma is not generated by the irradiation with the microwave.

(1) Details of Microwave Annealing 1

Hereafter, the microwave annealing performed in FIG. 3B will be described in detail.

In the present embodiment, the microwave annealing is performed as the sintering process as described above. The microwave annealing has a property that a place where a defect exists is heated selectively without heating the whole of the substrate 100.

The heating object in the sintering process of the present embodiment is not the whole of the substrate 100, but the interface between the substrate 100 and the gate insulator 102. The interface is a place where the material changes discontinuously and a large number of defects exist locally. In the present embodiment, therefore, the interface which is the heating object can be heated selectively by performing the microwave annealing as the sintering process.

According to such a sintering process, it becomes possible to efficiently lower the interface level density in the interface between the substrate 100 and the gate insulator 102 even at a low temperature by selectively heating the interface. In other words, it becomes possible to obtain, even at a low temperature, the sintering effect that can lower the interface level density. Therefore, even in the case where the semiconductor device includes a material which is degraded in characteristics by high-temperature heat treatment, it is possible to execute the sintering process using the microwave annealing while suppressing the characteristic degradation of such material by executing the sintering process at a low temperature.

Effects of the microwave annealing on the interface will be described from the viewpoint of the dangling bonds.

FIGS. 4A to 4C are schematic diagrams for explaining the effects of the microwave annealing on the dangling bonds.

FIG. 4A schematically shows silicon (Si) atoms forming the substrate 100, silicon (Si) and oxygen (O) atoms forming the gate insulator 102, and covalent bonds among these atoms. In FIG. 4A, X denote a dangling bond existing in an interface S between the substrate 100 and the gate insulator 102.

As described above, the microwave annealing has the property that a place having defects is heated selectively without heating the whole of the substrate 100. As regards its mechanism, however, unclear points still remain. However, a model in which the microwave is absorbed by incomplete Si—Si bonds and the temperature in their vicinities rises locally when silicon is irradiated with microwave is proposed. Considering this model, it is considered that the microwave annealing has effects on the dangling bonds as shown in FIGS. 4B and 4C.

FIGS. 4B and 4C show changes of the dangling bonds obtained when the microwave annealing is performed in an atmosphere which does not contain hydrogen and in an atmosphere which contains hydrogen, respectively. In the former case, Si—O bond pairing is changed at the interface S and dangling bonds are coupled via an O atom (FIG. 4B). On the other hand, in the latter case, dangling bonds are terminated by hydrogen (H) atoms (FIG. 4C).

From this, it is considered that the sintering process using the microwave annealing is effective both in the atmospheres which does not contain hydrogen and contains hydrogen. In the present embodiment, therefore, the sintering process may be performed in either of the atmospheres which does not contain hydrogen and contains hydrogen.

However, in order to enhance the sintering effect, it is desirable to perform the sintering process in the atmosphere which contains hydrogen. On the other hand, if the semiconductor device includes a material which is degraded in characteristics by the reducing atmosphere of hydrogen, it is desirable to perform the sintering process in the atmosphere which does not contain hydrogen.

When supplying hydrogen into a reaction chamber in which the sintering process is to be performed, hydrogen may be supplied into the chamber singly, or may be supplied in a mixture with another gas. An example of such a gas includes an inert gas such as nitrogen ($N_2$). Another example of the hydrogen supply method includes a method of previously installing a hydrogen supply source in the vicinity of the MOS transistors Tr and discharging the hydrogen at the time of the sintering process. A specific example of this method includes a method of previously forming a thin film containing hydrogen in the vicinity of the MOS transistors Tr, and a method of previously causing the substrate 100 to contain hydrogen by implanting hydrogen ions from the back side of the substrate 100.

In the present embodiment, not only the interface between the substrate 100 and the gate insulator 102, but also the substrate 100 is heated by the irradiation with the microwave. In general, however, there are a large number of defects in the interface between the substrate 100 and the gate insulator 102 because the material changes discontinuously, so that the microwave is absorbed selectively by these defects. As a mechanism of the microwave annealing, a model in which energy of the microwave absorbed by the defects causes some interface reaction in the interface between the substrate 100 and the gate insulator 102 is also considered.

Effects of the sintering process using the microwave annealing will be compared with effects of other sintering processes.

Figure 5:
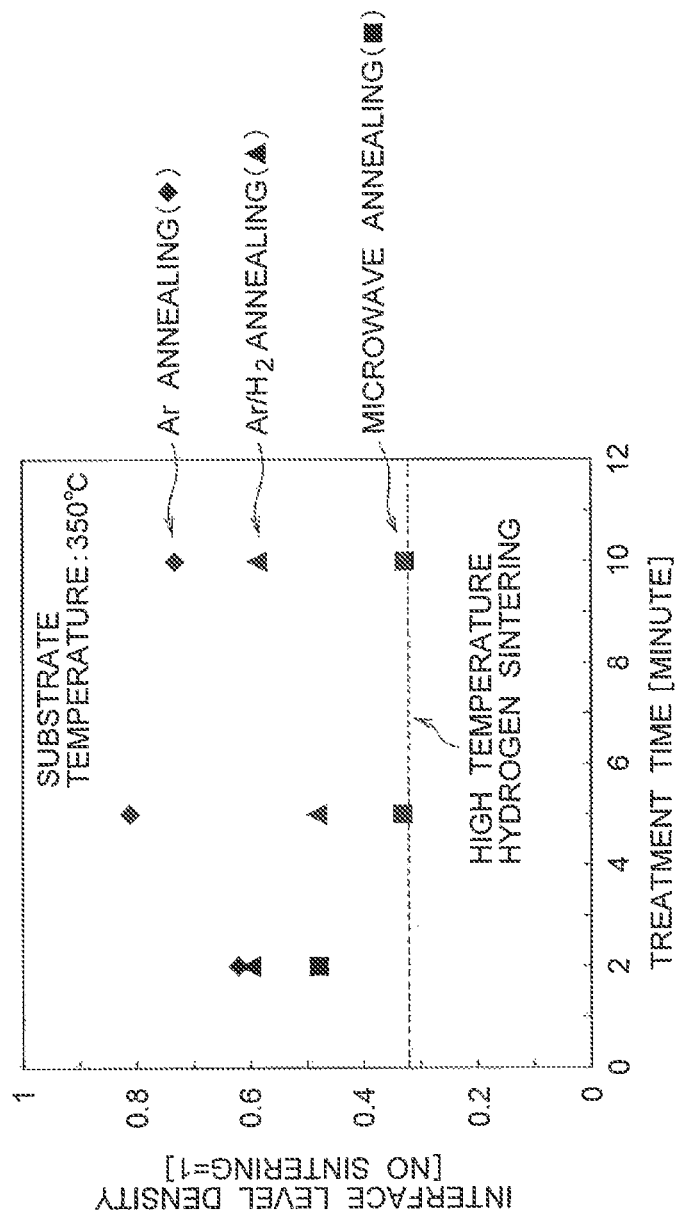
FIG. 5 is a graph showing measured results of the interface level density in the interface between a substrate and a gate insulator when sintering processes are performed under various conditions.

FIG. 5 is a graph showing measured results of the interface level density in the interface between the substrate 100 and the gate insulator 102 when the sintering processes are performed under various conditions.

In FIG. 5, the interface level densities when various sintering processes have been performed are indicated by ratios with the interface level density in the case where no sintering process is performed being set equal to 1. The temperature of the substrate 100 is 350° C. in any of these sintering processes.

In the case where the substrate 100 is heated in a heat treatment furnace having an Ar atmosphere, the interface level density is approximately in a range of 0.62 to 0.81. Furthermore, in the case where the substrate 100 is heated in a heat treatment furnace having an $Ar/H_2$ atmosphere, the interface level density is approximately in a range of 0.66 to 0.82.

On the other hand, in the case where the substrate 100 is heated by the microwave annealing, the interface level density is improved approximately to 0.32. This is a result which is as good as that of high temperature hydrogen sintering represented by a dashed line in FIG. 5. In this high temperature hydrogen sintering, heating is performed at 450° C. for 30 minutes in a heat treatment furnace having an atmosphere which contains $H_2$ of approximately 10%. It is appreciated that, at a temperature as low as 350° C., the microwave annealing brings about a sintering effect which is the same degree as that of the high temperature hydrogen sintering at 450° C.

It is appreciated from the results described above that when performing the sintering processes at the same processing temperature for the same processing time period, the microwave annealing is effective in lowering the interface level density as compared with other sintering processes.

(2) Details of Microwave Annealing 2

The sintering process using the microwave annealing will be described in detail, regarding the point that the sintering process is performed after the topmost interconnect layer is formed and processed, with reference to FIG. 3B again.

In the present embodiment, the microwave annealing is performed after the third interconnect layer 115, which is the topmost interconnect layer, is formed and processed as described above. This has mainly two advantages described below.

First, there is an advantage that the interface between the substrate 100 and the gate insulator 102 can avoid being damaged by interconnect processing after the sintering process.

Since the substrate 100 is exposed to plasma during dry etching, characteristics of the interface between the substrate 100 and the gate insulator 102 are degraded. Therefore, if the processing of the interconnect layers is performed after the sintering process, the characteristics of the interface improved by the sintering process are degraded again. In the present embodiment, therefore, the sintering process using the microwave annealing is performed after the processing of the topmost interconnect layer. As a result, it can be avoided that the interface is damaged by the interconnect processing after the sintering process.

Secondly, there is an advantage that H atoms supplied to the interface between the substrate 100 and the gate insulator 102 can avoid slipping out by influence of plasma generated during the interconnect processing.

If the processing of the interconnect layers is performed after the sintering process, H atoms supplied to the interface slip out due to the influence of the plasma for dry etching. In the present embodiment, therefore, the sintering process using the microwave annealing is performed after processing of the topmost interconnect layer. As a result, the H atoms supplied to the interface can avoid slipping out due to the influence of the plasma.

There are two kinds in damages to the interface caused by the plasma, as described below. A first damage is a physical damage caused when plasma ions collide with the interface. This is called ion collision damage. A second damage is a damage caused by a fact that interconnects are electrified by the plasma and these charges flow into the interface. This is called charge up damage.

In general, the interconnect structure of the logic LSI includes a large number of interconnect layers (for example, interconnect layers in approximately ten layers). However, in general, the ion collision damage to the interface by the processing of the second and subsequent interconnect layers is smaller than the damage by the processing of the first interconnect layer. As this reason, it is considered that as the order of the interconnect layer becomes higher, 1) the distance between the MOS transistors Tr and the interconnect layer becomes larger, 2) the interconnect patterns become larger and simpler, and 3) the protection effect given by the lower order inter layer dielectrics and interconnect layers becomes greater. On the other hand, in general, the charge up damage to the interface by the processing of the second and subsequent interconnect layers becomes greater due to the antenna effect as compared with that by the processing of the first interconnect layer.

Therefore, if the damage and influence to the interface by the processing of the second and subsequent interconnect layers is considered to be slight in consideration of the ion collision and charge up damages by the interconnect processing, the sintering process using the microwave annealing may be performed after the first interconnect layer is formed and processed. Specifically, the sintering process may be performed at any time as long as it is performed after the first interconnect layer 110 is processed in the process shown in FIG. 2A. The effect that the interface level density is lowered efficiently even at a low temperature can be also obtained in such a sintering process.

(3) Setting Conditions of Microwave Annealing

Setting conditions of the microwave annealing of FIG. 3B will be described.

The microwave annealing in the present embodiment is executed by using a microwave in the range of, for example, 2.45 to 25.0 GHz, with the temperature of the substrate 100 being adjusted to be in the range of 200 to 450° C. (preferably in the range of 300 to 400° C.), and with supplied power in the range of 10 W/cm$^2$ to 10 kW/cm$^2$ for a time period in the range of 30 seconds to 60 minutes.

The atmosphere during the annealing may be an atmosphere containing an inert gas such as $N_2$ (nitrogen) or Ar (argon) as its main component, or may be an atmosphere containing an inert gas and $H_2$ (hydrogen) which accounts for approximately 10 to 50% (for example, approximately 10%) of the inert gas. The pressure during the annealing may be any of high pressure, atmospheric pressure, and low pressure.

The microwave annealing apparatus used in the microwave annealing may be a single wafer processing type, or may be a batch processing type. The number of times of irradiation with the microwave in the process of FIG. 3B may be one, or may be two or more.

The microwave will be described complementarily. The microwave is prescribed as an electromagnetic wave having a frequency in the range of 300 MHz to 3 THz (a wavelength in the range of 100 μm to 1 m). As regards the frequency of the microwave, 2.45 GHz, 5.80 GHz and 24.125 GHz are specified as the ISM (Industrial, Scientific, and Medical use) band. Regarding microwaves of these frequencies, magnetrons for generating them can be obtained inexpensively. Therefore, it is desirable to perform the microwave annealing in the present embodiment by using the microwave having a frequency in the range of 2.45 to 25.0 GHz as described above.

Furthermore, 5.8 GHz is a most suitable frequency to heat silicon. Therefore, in the case where the substrate 100 is a silicon substrate, it is desirable to set the frequency of the microwave to a frequency near 5.8 kHz, for example, a frequency in the range of 3 to 8 GHz. As a result, the heating efficiency of the substrate 100 can be made favorable. Even if the substrate 100 is a semiconductor substrate other than a silicon substrate, the most suitable frequency for heating is not much different. Therefore, the frequency in the range of 3 to 8 GHz is also effective in heating semiconductor substrates other than the silicon substrate,

(4) Microwave Irradiation Side in Microwave Annealing

A microwave irradiation side in the microwave annealing of FIG. 3B will be described.

In the microwave annealing in the present embodiment, only either the front side or the back side of the substrate 100 may be irradiated with the microwave, or both sides may be irradiated with the microwave.

In general, if the front side of the substrate is irradiated with the microwave in an LSI having a multilayer interconnect structure, the microwave is reflected and absorbed by the interconnects and therefore the interconnect pattern dependence of in-plane temperature distribution of the substrate is caused in some cases. When such a substrate is viewed from the above, the substrate often has a structure in which MOS transistors are hidden by the interconnects. In this case, if the front side of the substrate is irradiated with the microwave, it is considered that the interface between the substrate and the gate insulator is not irradiated sufficiently with the microwave, so that a sufficient sintering effect cannot be obtained.

In this case, it is effective to irradiate the back side of the substrate with the microwave. Typically, circuit patterns do not exist on the back side of the substrate and interconnect layers are not formed on the back side. Therefore, it is considered that the microwave with which the back side is irradiated acts on the interface efficiently and evenly.

In the present embodiment, therefore, it is desirable to irradiate the back side of the substrate 100 with the microwave in the case where the number of interconnect layers in the multilayer interconnect structure is large. Even in the case where the number of interconnect layers is large, therefore, it becomes possible to irradiate the interface between the substrate 100 and the gate insulator 102 sufficiently with the microwave and obtain a sufficient sintering effect.

On the other hand, in the present embodiment, the front side of the substrate 100 may be irradiated with the microwave. Such an irradiation has an advantage that the irradiation process can be executed easily as compared with the case where the back side of the substrate 100 is irradiated with the microwave.

In the present embodiment, both the front side and the back side of the substrate 100 may be irradiated with the microwave simultaneously. Even if there is a part to which the microwave is not applied in irradiation of the front side, the microwave can be applied to such a part by irradiation from the back side, resulting in an advantage. In this case, an insulation film may be formed on the back side of the substrate 100, and the formed insulation film may be removed. Furthermore, the substrate 100 may be processed to become thin concurrently with removal of the insulation film by polishing the back side of the substrate 100 before irradiation with the microwave. This process has an advantage that the transmittance of the microwave applied from the back side is improved.

In the case where both the front side and the back side of the substrate 100 are irradiated with the microwave, it is desirable to irradiate both sides with the microwave simultaneously. However, the both sides may be irradiated in order.

(5) Effects of First Embodiment

Finally, effects of the first embodiment will be described.

As described above, the microwave annealing in the present embodiment is performed as the sintering process. According to such a sintering process, it is possible to efficiently lower the interface level density in the interface between the substrate 100 and the gate insulator 102 even at a low temperature by selectively heating the interface. Therefore, even in the case where the semiconductor device includes a material which is degraded in characteristics by high temperature heat treatment, it becomes possible to execute the sintering process while suppressing the characteristic degradation of such a material by executing the microwave annealing at a low temperature.

Furthermore, the sintering process using the microwave annealing can be performed in either of an atmosphere which contains hydrogen and an atmosphere which does not contain hydrogen. Therefore, even in the case where the semiconductor device includes a material which is degraded in characteristics by a reducing atmosphere of hydrogen, it is possible to execute the sintering process while suppressing the characteristic degradation of such a material by executing the microwave annealing in an atmosphere which does not contain hydrogen, in the present embodiment.

In this way, the present embodiment is promising as the sintering process of the semiconductor device including a material which is susceptible to a high temperature and a hydrogen atmosphere, and the present embodiment contributes to improvement of the reliability of such a material. Examples of a material for which there is a concern of being degraded by a high temperature and a hydrogen atmosphere include metals such as Sr, Cu, Ni, Bi, Mn, Hf, Zr, Ti, Al and Mg, and metallic compounds containing these metallic elements.

In the present embodiment, the sintering process using the microwave annealing is performed after forming the topmost interconnect layer and processing the topmost interconnect layer into the interconnect patterns. As a result, it is possible for the interface to avoid being damaged by plasma during the interconnect processing and avoid slipping out due to the influence of the plasma, after the sintering process.

However, in the case where the semiconductor device is the logic LSI, if the damage and influence by the processing of the second and subsequent interconnect layers are considered to be slight, the sintering process using the microwave annealing may be performed after the first interconnect layer is formed and processed.

In the present embodiment, the setting conditions of the microwave annealing have been exemplified. However, other setting conditions may be adopted. Regarding the setting conditions, however, it is desirable to set conditions capable of sufficiently lowering the interface level density in the interface between the substrate 100 and the gate insulator 102 without degrading characteristics of other materials of the semiconductor device.

In the present embodiment, the semiconductor device is supposed to be the logic LSI. However, the semiconductor device may be another type of IC. For example, the semiconductor device may be a CMOS image sensor which requires a stabilized interface in the same way as the logic LSI.

In the present embodiment, each interconnect layer may be formed and processed by the dual-damascene method. In this case, each interconnect layer is formed by 1) a process of forming contact holes or via holes and interconnect trenches in an inter layer dielectric by dry etching or the like; 2) a process of forming a barrier metal layer and an interconnect layer on the inter layer dielectric after the holes and trenches are formed; and 3) a process of removing an unnecessary portion of the interconnect layer by chemical mechanical polishing (CMP), dry etching or the like to process the interconnect layer into interconnect patterns. In this case as well, the sintering process may be performed after the topmost interconnect layer is processed, or the first interconnect layer is processed. In addition, in the case where the unnecessary portion of the interconnect layer is removed by CMP, the sintering process may be performed after the interconnect trenches for the topmost interconnect layer are formed, or after the interconnect trenches for the first interconnect layer are formed.

Hereafter, a second embodiment which is a modification of the first embodiment will be described. The second embodiment will be described laying stress on differences from the first embodiment.

Second Embodiment

FIGS. 6A to 8B are side sectional views showing a method of manufacturing a semiconductor device of the second embodiment. In the second embodiment, a semiconductor memory LSI is manufactured as the semiconductor device.

The semiconductor device in the present embodiment differs from the semiconductor device in the first embodiment in that a semiconductor memory element is included. The semiconductor memory element may be formed on a substrate surface, or may be formed in an interconnect layer. Examples of the semiconductor device including the memory element on the substrate surface include a DRAM having a trench capacitor and the like. On the other hand, examples of the semiconductor device including the memory element in the interconnect layer include a DRAM having a stack capacitor, a ferroelectric random access memory (FeRAM) of 1T1C type, a magnetoresistive random access memory (DRAM), a resistance random access memory (ReRAM), a phase change memory (PCM) and the like. The present embodiment can be applied to any of these memories.

Hereafter, the method of manufacturing the semiconductor device of the present embodiment will be described by taking a semiconductor memory LSI having a capacitor Cp as the semiconductor memory element, as an example.

Figure 6A:
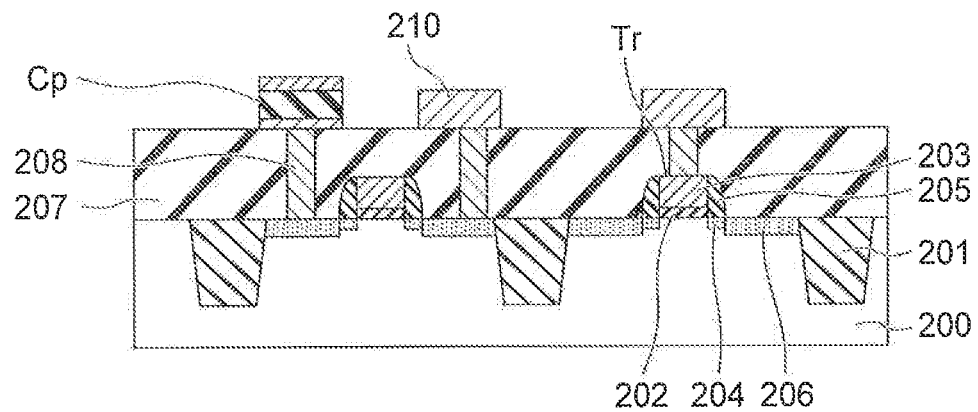
FIGS. 6A to 8B are side sectional views showing a method of manufacturing a semiconductor device of a second embodiment.

FIG. 6A shows isolation insulators 201, gate insulators 202, gate electrodes 203, extension regions 204, sidewall insulators 205, source and drain regions 206, an inter layer dielectric 207, and contact plugs 208 formed on or in the substrate 200. FIG. 6A further shows a first interconnect layer 210 as a first layer of interconnect layers formed on the substrate 200. FIG. 6A further shows MOS transistors Tr for the semiconductor memory LSI formed on the substrate 200. These components can be formed by the processes shown in FIGS. 1A to 2A. Examples of the MOS transistors Tr include cell transistors, selection transistors, peripheral transistors and the like.

FIG. 6A further shows the capacitor Cp formed in the first interconnect layer 210. The capacitor Cp includes a lower electrode 211, a capacitor insulator 212, and an upper electrode 213 stacked on a contact plug 208 in order. Each of the upper electrode 213 and the lower electrode 211 may be formed of only a metallic layer, or may be formed by stacking two or more metallic layers.

The capacitor Cp can be formed by forming an electrode material for the upper electrode 213, an insulation material for the capacitor insulator 212, and an electrode material for the lower electrode 211 successively and processing these materials by etching. The capacitor Cp may be formed before the first interconnect layer 210 is formed and processed, or may be formed after the first interconnect layer 210 is formed and processed. The interconnect patterns of the first interconnect layer 210 and the capacitor Cp are insulated from each other by a first inter layer dielectric 209 as a first layer of inter layer dielectrics, which will be described later.

Figure 6B:
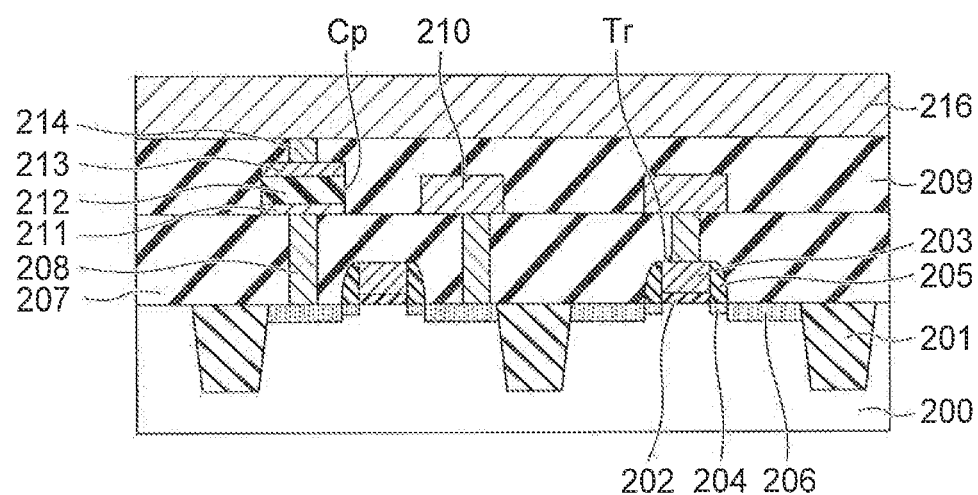

As shown in FIG. 6B, the first inter layer dielectric 209 is formed on the inter layer dielectric 207 which is located under the interconnect structure, to cover the first interconnect layer 210 and the capacitor Cp. A first via plug 214 as a via plug in a first via plug layer is formed in the first inter layer dielectric 209. A second interconnect layer 216 as a second layer of the interconnect layers is formed on the first inter layer dielectric 209.

Figure 7A:
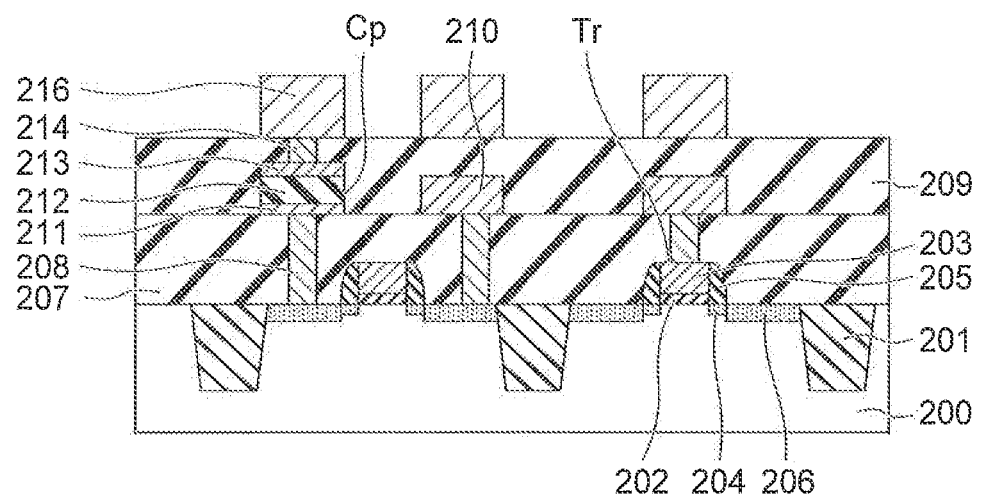

As shown in FIG. 7A, the second interconnect layer 216 is then processed into interconnect patterns by dry etching such as RIE. In this way, the interconnect patterns of the second interconnect layer 216 are formed on the first inter layer dielectric 209.

Figure 7B:
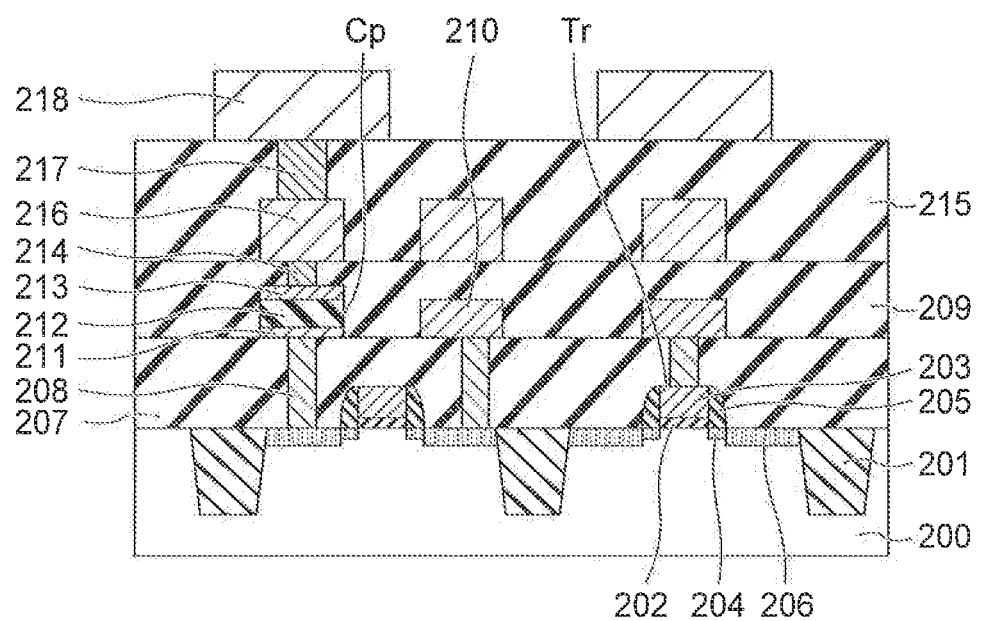
Figure 8A:
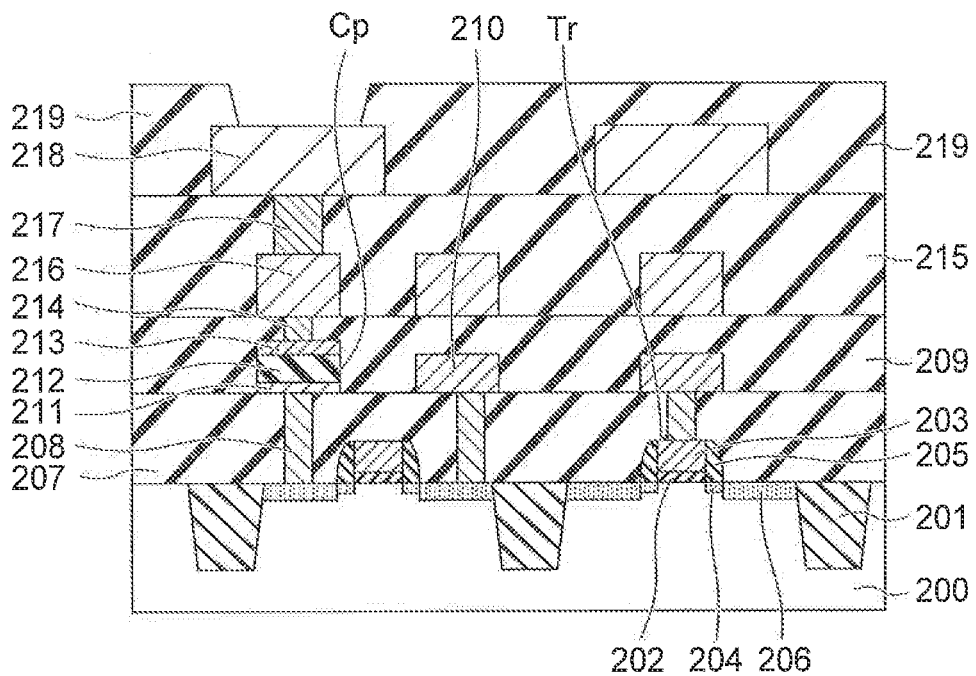

In the present embodiment, processes similar to those of FIGS. 23 and 3A are then performed. As a result, as shown in FIGS. 7B and 8A, an second inter layer dielectric 215 as a second layer of the inter layer dielectrics, a second via plug 217 as a via plug in a second via plug layer, interconnect patterns of a third interconnect layer 218 as a third layer of the interconnect layers, and a passivation film 219 are formed above the substrate 200.

Figure 8B:
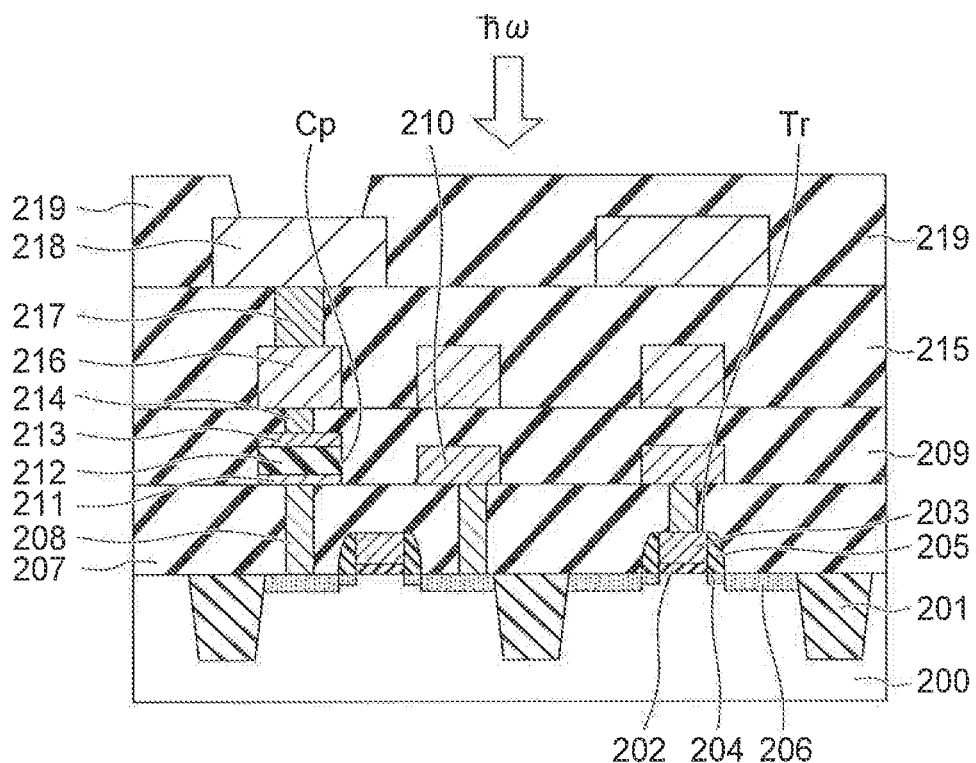

A sintering process which heats the substrate 200 is then performed to lower the interface level density in the interface between the substrate 200 and the gate insulator 202 (FIG. 8B). In the present embodiment, microwave annealing of the substrate 200 is performed as the sintering process in the same way as the first embodiment. In other words, the substrate 200 is annealed by irradiating the substrate 200 with the microwave. As a result, the interface level density in the interface between the substrate 200 and the gate insulator 202 is lowered.

Regarding the setting conditions of the microwave annealing, it is desired to set conditions under which the interface level density in the interface between the substrate 200 and the gate insulator 202 can be lowered to a desired degree without degrading characteristics of other materials (for example, materials of the capacitor Cp) in the semiconductor device.

The present embodiment has been described by taking the case where each memory cell is formed of at least one transistor Tr and one capacitor Cp as an example. However, the memory cell may be formed of only one transistor. Examples of the semiconductor memory including such a memory cell include a flash memory of floating gate type or charge trap type, a ferroelectric memory of one transistor type, a 1T-DRAM and the like. Furthermore, the memory cell may be formed of at least one transistor and one resistance change element. Examples of the semiconductor memory having such a memory cell include an MRAM, a ReRAM, a PCM and the like. Furthermore, the memory cell may be disposed two-dimensionally, or may be disposed three-dimensionally.

Effects of Second Embodiment

Finally, effects of the second embodiment will be described.

As described above, the microwave annealing in the present embodiment is performed as the sintering process in the same way as the first embodiment. According to the present embodiment, therefore, it is possible to efficiently lower the interface level density in the interface between the substrate 100 and the gate insulator 102 even at a low temperature by selectively heating the interface. In addition, even in the case where the semiconductor device includes a material which is degraded in characteristics by a high temperature or a hydrogen atmosphere, it is possible to execute the sintering process while suppressing the characteristic degradation of such a material by executing the microwave annealing at a low temperature or in an atmosphere which does not contain hydrogen, in the present embodiment.

Furthermore, a semiconductor memory LSI is manufactured as the semiconductor device in the present embodiment. Therefore, characteristic degradation of the memory element material in the sintering process poses a problem. However, since the interface level density can be lowered efficiently even at a low temperature according to the present embodiment, it is possible to execute the sintering process while suppressing the characteristic degradation of the memory element material.

Furthermore, in the present embodiment, the sintering process using the microwave annealing is performed after the topmost interconnect layer is formed and processed, as in the first embodiment. As a result, it is possible for the interface to avoid being damaged by plasma during the interconnect processing and avoid slipping out due to the influence of the plasma, after the sintering process.

According to the present embodiment, in the case where the semiconductor device is the semiconductor memory LSI, it is possible to suppress the characteristic degradation of the memory element material caused by the sintering process. Therefore, in the case where 1) the total number of the interconnect layers of the semiconductor device is N where N is an integer of 2 or more; 2) the N interconnect layers includes one or more interconnect layers including memory elements; and 3) a topmost interconnect layer included in the one or more interconnect layers is a K-th interconnect layer where K is an integer satisfying the relation represented by $1 \leq K \leq N-1$, the sintering process may be performed after a (K+1)-th interconnect layer is formed and processed in the present embodiment.

This will be described with reference to FIGS. 6A to 8B. The total number N of the interconnect layers of the semiconductor device is 3. The layer number K of the topmost layer among the one or more interconnect layers including the memory elements is 1 (in other words, the memory elements exist only in the first interconnect layer 210). Therefore, in the present embodiment, the sintering process using the microwave annealing may be performed after the second interconnect layer 216 is formed and processed. In other words, the sintering process may be performed at any time as long as it is after the second interconnect layer 216 is processed in the process of FIG. 7A. This is useful in the case where, for example, the damage and influence to the interface by the processing of the third interconnect layer 218 are considered to be slight.

Furthermore, in the present embodiment, each interconnect layer may be formed and processed by the dual-damascene method. In this case as well, the sintering process may be performed after the topmost interconnect layer is processed, or the (K+1)-th interconnect layer is processed. In addition, in the case where the removal of the unnecessary portion of the interconnect layer is performed by CMP, the sintering process may be performed after the interconnect trenches for the topmost interconnect layer are formed, or after the interconnect trenches for the (K+1)-th interconnect layer are formed.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, the method comprising:

forming a transistor including a gate insulator and a gate electrode above a substrate;

forming an interconnect structure including one or more interconnect layers above the substrate by performing first and second processes one or more times, the first process forming an interconnect layer above the substrate, and the second process processing the interconnect layer into an interconnect pattern; and annealing the substrate by irradiating the substrate with a microwave, after at least one interconnect layer included in the one or more interconnect layers is processed into an interconnect pattern above the substrate, wherein the annealing heats an interface between the substrate and the gate insulator, and the method further includes discharging hydrogen during the annealing from a hydrogen supply source which is in a vicinity of the transistor.

2. The method of claim 1, wherein the annealing is performed after a topmost interconnect layer included in the one or more interconnect layers is formed above the substrate and the topmost layer is processed into an interconnect pattern.

3. The method of claim 1, wherein a temperature of the substrate when the annealing is performed is equal to or lower than 450° C.

4. The method of claim 1, wherein a temperature of the substrate when the annealing is performed is equal to or higher than 200° C.

5. The method of claim 1, wherein the annealing is performed in an atmosphere including hydrogen molecules.

6. The method of claim 1, wherein the annealing is performed in an atmosphere including hydrogen molecules and an inert gas.

7. The method of claim 1, wherein a front side and/or a back side of the substrate are irradiated with the microwave.

8. The method of claim 7, wherein the back side is irradiated with the microwave after polishing the back side.

9. The method of claim 1, wherein a frequency of the microwave is 2.45 GHz to 25.0 GHz.

10. The method of claim 1, wherein a frequency of the microwave is 3 GHz to 8 GHz.

11. The method of claim 1, wherein the annealing is performed after a film containing hydrogen is formed as the hydrogen supply source in a vicinity of the transistor.

12. The method of claim 1, wherein the annealing is performed after hydrogen is implanted into the substrate to form the hydrogen supply source.

13. A method of manufacturing a semiconductor device, the method comprising:

forming a transistor for a logic circuit above a substrate, the transistor including a gate insulator and a gate electrode;

forming an interconnect structure including one or more interconnect layers above the substrate by performing first and second processes one or more times, the first process forming an interconnect layer above the substrate, and the second process processing the interconnect layer into an interconnect pattern; and annealing the substrate by irradiating the substrate with a microwave, after a bottommost interconnect layer included in the one or more interconnect layers is formed above the substrate and the bottommost interconnect layer is processed into an interconnect pattern, wherein the annealing heats an interface between the substrate and the gate insulator, and the method further includes discharging hydrogen during the annealing from a hydrogen supply source which is in a vicinity of the transistor.

14. The method of claim 13, wherein a temperature of the substrate when the annealing is performed is equal to or lower than 450° C.

15. The method of claim 13, wherein the annealing is performed in an atmosphere including hydrogen molecules.

16. The method of claim 13, wherein a front side and/or a back side of the substrate are irradiated with the microwave.

17. A method of manufacturing a semiconductor device, the method comprising:

forming a transistor for a memory circuit above a substrate, the transistor including a gate insulator and a gate electrode;

forming an interconnect structure including N interconnect layers above the substrate by performing first and second processes N times, where N is an integer of 2 or more, the first process forming an interconnect layer above the substrate, and the second process processing the interconnect layer into an interconnect pattern; and annealing the substrate by irradiating the substrate with a microwave, after a (K+1)-th interconnect layer is formed above the substrate and the (K+1)-th interconnect layer is processed into an interconnect pattern, in a case where the N interconnect layers include one or more interconnect layers including memory elements and a K-th interconnect layer is a topmost interconnect layer included in the one or more interconnect layers, where K is an integer satisfying a relation of $1 \leq K \leq N-1$, wherein the annealing heats an interface between the substrate and the gate insulator, and the method further includes discharging hydrogen during the annealing from a hydrogen supply source which is in a vicinity of the transistor.

18. The method of claim 17, wherein a temperature of the substrate when the annealing is performed is equal to or lower than 450° C.

19. The method of claim 17, wherein the annealing is performed in an atmosphere including hydrogen molecules.

20. The method of claim 17, wherein a front side and/or a back side of the substrate are irradiated with the microwave.

21. The method of claim 1, wherein the annealing is performed without generating plasma by the microwave.

22. The method of claim 1, wherein a back side of the substrate is irradiated with the microwave.

23. A method of manufacturing a semiconductor device, the method comprising:

forming a transistor including a gate insulator and a gate electrode above a substrate;

forming an interconnect structure including one or more interconnect layers above the substrate by performing first and second processes one or more times, the first process forming an interconnect layer above the substrate, and the second process processing the interconnect layer into an interconnect pattern; and annealing the substrate in an atmosphere including hydrogen molecules by irradiating the substrate with a microwave, after at least one interconnect layer included in the one or more interconnect layers is processed into an interconnect pattern above the substrate.

24. A method of manufacturing a semiconductor device, the method comprising:

forming a transistor for a logic circuit above a substrate, the transistor including a gate insulator and a gate electrode;

forming an interconnect structure including one or more interconnect layers above the substrate by performing first and second processes one or more times, the first process forming an interconnect layer above the substrate, and the second process processing the interconnect layer into an interconnect pattern; and annealing the substrate in an atmosphere including hydrogen molecules by irradiating the substrate with a microwave, after a bottommost interconnect layer included in the one or more interconnect layers is formed above the substrate and the bottommost interconnect layer is processed into an interconnect pattern.

25. A method of manufacturing a semiconductor device, the method comprising:

forming a transistor for a memory circuit above a substrate, the transistor including a gate insulator and a gate electrode;

forming an interconnect structure including N interconnect layers above the substrate by performing first and second processes N times, where N is an integer of 2 or more, the first process forming an interconnect layer above the substrate, and the second process processing the interconnect layer into an interconnect pattern; and annealing the substrate in an atmosphere including hydrogen molecules by irradiating the substrate with a microwave, after a (K+1)-th interconnect layer is formed above the substrate and the (K+1)-th interconnect layer is processed into an interconnect pattern, in a case where the N interconnect layers include one or more interconnect layers including memory elements and a K-th interconnect layer is a topmost interconnect layer included in the one or more interconnect layers, where K is an integer satisfying a relation of $1 \leq K \leq N-1$.

* * * * *